United States Patent
Dijkstra et al.

(10) Patent No.: US 9,691,959 B2
(45) Date of Patent: Jun. 27, 2017

(54) LIGHT EMITTING DEVICE PACKAGE

(71) Applicant: KONINKLIJKE PHILIPS N.V., Eindhoven (NL)

(72) Inventors: Paul Dijkstra, Eindhoven (NL); Aernout Reints Bok, Eindhoven (NL); Pascal Johannes Theodorus Lambertus Oberndorff, Eindhoven (NL); Lu Fei Zhang, Eindhoven (NL); Boudewijn Ruben De Jong, Eindhoven (NL); Marcus Franciscus Donker, Wijchen (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/104,387

(22) PCT Filed: Jan. 7, 2015

(86) PCT No.: PCT/IB2015/050121
§ 371 (c)(1),
(2) Date: Jun. 14, 2016

(87) PCT Pub. No.: WO2015/092781
PCT Pub. Date: Jun. 25, 2015

(65) Prior Publication Data
US 2016/0315237 A1    Oct. 27, 2016

(30) Foreign Application Priority Data

Dec. 19, 2013  (WO) ............... PCT/CN2013/001603
Jan. 7, 2014   (EP) .................................... 14150307

(51) Int. Cl.
*H01L 33/00*     (2010.01)
*H01L 33/62*     (2010.01)
(Continued)

(52) U.S. Cl.
CPC ........... *H01L 33/62* (2013.01); *H01L 33/486* (2013.01); *H01L 33/60* (2013.01);
(Continued)

(58) Field of Classification Search
USPC ........................................... 257/98
See application file for complete search history.

(56) References Cited

U.S. PATENT DOCUMENTS

2007/0001278 A1  1/2007 Jeon et al.
2008/0012036 A1  1/2008 Loh et al.
(Continued)

OTHER PUBLICATIONS

EPO as ISA, International Search Report and Written Opinion dated Apr. 2, 2015 from International Application No. PCT/IB2015/050121, filed Jan. 7, 2015, 10 pages.

*Primary Examiner* — Timor Karimy
(74) *Attorney, Agent, or Firm* — Brian D. Ogonowsky; Patent Law Group LLP

(57) ABSTRACT

A packaged light emitting device die includes a package body having a profiled leadframe embedded in a body of reflecting material. The leadframe is exposed on mounting surface only on at least one solder bonding area. Solder is present only on the at least one solder bonding area and not elsewhere. The reflecting material provides the reflecting parts of the package so there is no need for a reflective layer to be deposited on leadframe. Moreover, the reflecting material can function as a solder resist to self-align the solder to the at least one solder bonding area.

4 Claims, 4 Drawing Sheets

(51) Int. Cl.
*H01L 33/60* (2010.01)
*H01L 33/48* (2010.01)

(52) U.S. Cl.
CPC .............. *H01L 2224/16245* (2013.01); *H01L 2224/32245* (2013.01); *H01L 2224/48091* (2013.01); *H01L 2224/48247* (2013.01); *H01L 2224/73265* (2013.01); *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 2012/0313131 A1* | 12/2012 | Oda | H01L 23/49503 257/98 |
| 2013/0020688 A1 | 1/2013 | Pan et al. | |
| 2013/0221509 A1 | 8/2013 | Oda et al. | |

* cited by examiner

LIGHT EMITTING DEVICE PACKAGE

CROSS-REFERENCE TO RELATED APPLICATIONS

The present application is a §371 application of International Application No. PCT/IB2015/050121 filed on Jan. 7, 2015 and entitled "LIGHT EMITTING DEVICE PACKAGE," which claims priority to International Application No. PCT/CN2013/001603 filed on Dec. 19, 2013 and European Patent Application No. 14150307.8 filed on Jan. 7, 2014. International Application No. PCT/IB2015/050121, International Application No. PCT/CN2013/001603, and European Patent Application No. 14150307.8 are incorporated herein.

FIELD OF THE INVENTION

The invention relates to a packaged light emitting device, a package for a light emitting device and a method of manufacturing the packaged device.

BACKGROUND OF THE INVENTION

A number of different approaches to generate light from a solid state light emitting device are known.

A very common approach is to use light emitting diodes (LEDs), which are in increasing use for a number of applications in view of their efficiency in generating light. In order to use such LEDs, LED dies are packaged to protect the die while allowing light to be emitted and to allow electrical connection to the LED die. Since LEDs can generate considerable amounts of heat, such packages may also need to allow the removal of heat and hence function as a heat sink.

LED technology does not represent the only way to generate light in solid state devices. In particular, an alternative approach involves the use of laser diodes. A large number of types of laser diodes are known, including in particular vertical cavity surface emitting lasers (VCSEL), vertical external cavity surface emitting lasers (VECSEL), heterostructure lasers, distributed feedback lasers, and external-cavity diode lasers.

For lighting and backlighting applications the use of VCSEL and VECSEL light emitting devices has been of particular interest. Such devices can efficiently emit light of a particular wavelength. The light emitted may be narrow band, which can be an advantage in some applications.

Where broad spectrum light, for example white light is required, this can be achieved from VCSEL and VECSEL type devices using phosphors. The reason for using phosphors with such devices is that there are technical difficulties in producing VCSEL and VECSEL devices with some wavelengths. One option is to use a blue VCSEL diode with a phosphor to create white light. However, the light emitted by such devices may be considered cold and it would therefore be beneficial to provide a warmer light color. These devices in particular are suitable for use in lighting applications.

A prior approach to packaging LEDs or other solid state light emitting devices is described by US2012/0313131. This document describes packaging an LED using an etched leadframe incorporated in a resin portion shaped to form the package body. The LED is mounted on the leadframe and connected to it either with wire bonding or with bump bonding. A reflective metal layer on the upper surface of the leadframe reflects light and hence increases illumination efficiency of the packaged LED.

A typical metal for such a reflective metal layer is silver. This may be prone to degradation in the form of tarnishing which can color the reflective metal layer and lead to reduced reflectivity. A further issue is the weak adhesion of mould compound to Ag leading to delamination risks.

Another approach to packaging an LED is provided by US2013/0026522. This document describes a leadframe with a silver coating combined with a resin package body. The resin package body is formed of a heat curable resin with reflective properties. In this way, light incident not only on the leadframe but also on the resin is reflected to improve illumination efficiency.

However, this package has a relatively simple structure. Although this may make manufacture of the package more straightforward assembly of the package requires additional wirebonding steps.

Other reflective resins used in a similar way in LED packaging are provided by US2011/0241048 and US2012/0286220.

US2013/0221509A1 discloses a leadframe for mounting LED elements which includes a frame body region and a large number of package regions arranged in multiple rows and columns in the frame body region. The package regions each include a die pad on which an LED element is to be mounted and a lead section adjacent to the die pad, the package regions being further constructed to be interconnected via a dicing region.

There therefore remains a need for an improved packaged light emitting device which is relatively straightforward to manufacture and which allows for ease of assembly of a die into the package body.

SUMMARY OF THE INVENTION

The invention is defined by the claims.

According to a first aspect of the invention, there is provided a packaged light emitting device comprising:

a package body comprising reflective material incorporating a profiled leadframe and defining a continuous mounting surface, wherein the profiled leadframe has a profile of varying thickness with at least one region of profiled leadframe exposed at the mounting surface to define at least one solder bonding area surrounded by the reflective material;

solder covering the at least one solder bonding area but not the surrounding reflective material; and a light emitting die mounted to the at least one solder bonding area.

In the case of this packaged device, solder covers the at least one bonding area completely but not the surrounding area(s). This makes the assembly of the die into the package body more straightforward, since the reflective material surrounding the at least one solder bonding area may act as a solder relief or solder resist giving rise to self-alignment of the solder because wetting of regions with solder apart from the solder bonding area is prevented or reduced.

The reflective material may be an organic reflective material or may be a suitable reflective silicone. A reflective moulding compound may be used as well.

The packaged light emitting device may have low resistance contacts resulting in good thermal and electrical performance.

The package body may be a leadless package body in which the leads of the profiled leadframe do not extend beyond the package body.

As well as the at least one solder bonding area, at least one wirebond area may also be provided by the leadframe which may also be exposed at the mounting surface. Such a wirebond area may be covered with a suitable wirebonding layer or stack of layers.

Substantially the whole mounting surface may be of the reflective material apart from the at least one solder bonding area and/or the at least one wirebond area. This means that substantially all of the regions which may need to reflect light are of reflective material. In contrast, in the documents cited above the light emitting device is mounted on a leadframe but part of the surface of the inside of the package is also the leadframe. By avoiding leadframe material except in the at least one solder bonding area and/or the at least one wirebond area any tarnishing of the metal leadframe, including materials deposited on the surface of the leadframe, does not affect the reflectivity of the package body.

The package body may be in the form of a reflector cup. Alternatively, the package body may be flat.

The profiled leadframe has a profile or shape of varying thickness meaning that the leadframe does not have a constant thickness wherein the thickness is defined as the distance between a bonding surface of the leadframe comprising the solder bonding areas and a surface opposite to the bonding surface. Also, in embodiments, the bonding surface is not in a single flat plane. Similarly and additionally, the surface opposite to the bonding surface may not be in a single flat plane.

Accordingly, a second aspect of the invention provides a method of packaging a light emitting device comprising:

providing a profiled leadframe of a predetermined shape and predetermined profile of varying thickness;

moulding the etched leadframe in a reflective material to define a package body defining a continuous mounting surface for mounting a light emitting device, wherein the predetermined shape and profile of the leadframe provides at least one region of profiled leadframe exposed at the mounting surface to define at least one solder bonding area wherein the remainder of the mounting surface is of the reflective material;

covering the at least one solder bonding area but not the remainder of the mounting surface with solder; and mounting a light emitting device die to the at least one solder bonding area.

The method provides a convenient manufacturing method.

The method may include depositing the solder on the mounting surface and using the reflective material exposed on the mounting surface as a solder resist to avoid wetting of the regions of the mounting surface other than the at least one solder bonding area with solder. In this way the solder is self-aligned with the exposed regions of the leadframe. The reflective material may be a material that is not wetted by solder or, in other words, on which there is no or hardly any adhesion of the solder and, thus, which is a material which repels the solder.

Mounting a light emitting device die to the at least one solder bonding area may comprise depositing solder bumps on the light emitting device die or depositing solder paste on the at least one solder bonding area, placing the light emitting device die with solder bumps over the mounting surface or placing the light emitting device on top of the solder paste, and heating the light emitting device die on the mounting surface to reflow the solder bumps. The solder bumps need not be placed with excessive or high precision since the reflective material acts as a solder resist to ensure that the solder is in the correct location over the at least one solder bonding area after the reflow step, thus providing for a self-alignment of the solder on the at least one solder bonding area.

To enhance adhesion, the method may include applying glue, flux or paste to the light emitting device die and/or the solder bonding areas before placing the light emitting device die.

A plurality of light emitting device dies may be packaged in parallel. To make this more straightforward, the step of providing a package body may provide a plurality of package bodies joined by bars, the method further comprising dividing the plurality of package bodies into single package bodies containing respective dies after mounting a light emitting device die or multiple dies to each respective package body.

The package body may be formed by introducing a profiled leadframe into a mould, introducing reflective mould compound into the mould, and hardening the reflective mould compound to form the reflective material. This provides a convenient manufacturing method.

A layer of silver may be deposited on the profiled leadframe before introducing the leadframe into the mould. The silver is only present on the leadframe, and so need only be exposed at the at least one solder bonding areas where it is covered by solder in the finished product. Since the silver is not used as a reflector, because it is completely covered by the solder, no problems result from tarnishing of silver.

Alternatively, the provision of metal coating layers on the leadframe may be avoided. The avoidance of a silver coating can enhance adhesion. Thus, the leadframe may be of copper or copper alloy without any additional layers when the leadframe is introduced into the mould.

In a further alternative specific metal coating layers are applied only at functional areas of the leadframe for example in a solder contact area or a wire bonding area. The metal coating layers may be applied, for example, by single sided plating or spot plating.

The profiled leadframe may be formed by providing a leadframe of constant thickness with opposed surfaces and etching the leadframe on at least one of the opposed surfaces to form the profiled leadframe having a profile of varying thickness.

An encapsulant may be provided surrounding the packaged die and in contact with the packaged body.

According to a third aspect of the invention, there is provided a light emitting device package body comprising: reflective material incorporating an etched leadframe and defining a continuous mounting surface for mounting an LED; wherein the etched leadframe is shaped to have regions of etched leadframe exposed at the mounting surface to define at least one self-aligned solder bonding area but not to be present elsewhere at the mounting surface which is of the reflective material.

BRIEF DESCRIPTION OF THE DRAWINGS

Examples of the invention will now be described in detail with reference to the accompanying drawings, in which.

The drawings are schematic and not to scale. In particular, thin foils or layers may be shown with increased thickness for clarity.

DETAILED DESCRIPTION OF THE EMBODIMENTS

The invention provides a method of packaging a light emitting device and a packaged light emitting device.

Figure 1:
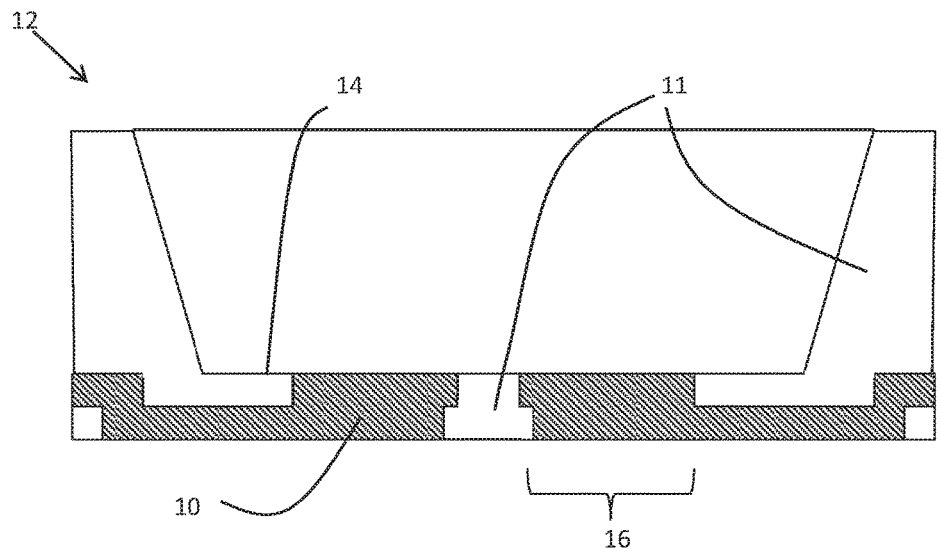
FIG. 1 shows a package for an LED die.
Figure 2:
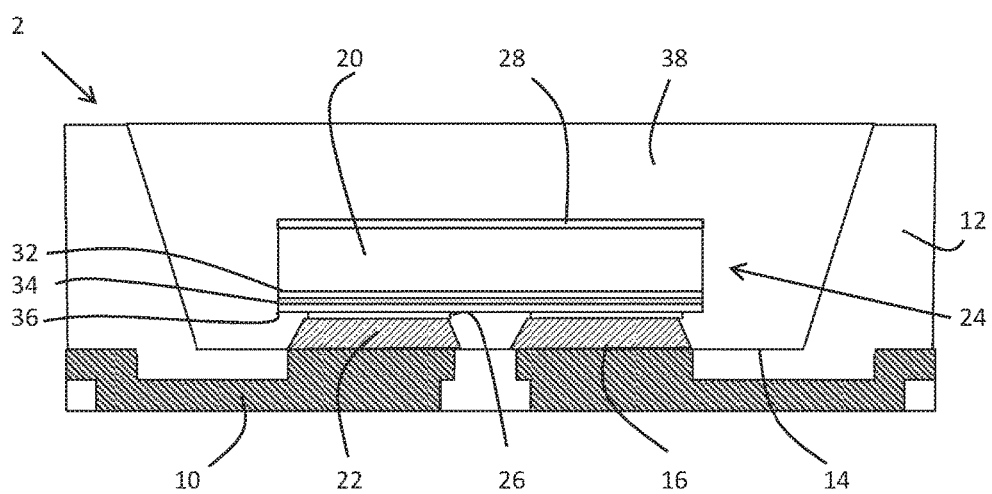
FIG. 2 shows a packaged LED including an LED die mounted in the package of FIG. 1.

Referring to FIG. 1, a general view of a package is shown. FIG. 2 shows a packaged light emitting device, i.e. a light emitting device die in the package of FIG. 1. In this example the light emitting device is a LED but similar packaging approaches may be used for other solid state light emitting devices.

Referring to FIG. 1, a profiled leadframe 10 is made of Cu and has been etched to have a particular profile or shape, for example the leadframe 10 has a varying thickness as illustrated in FIG. 1, and/or the leadframe 10 has a shape with dimensions that vary at least in two directions. The thickness is in this case defined as the distance between an upper surface of the leadframe 10, on which the bonding will be done, and a surface opposite to this bonding surface. As can be seen in FIG. 1 leadframe 10 has a profile or shape in which an upper surface of the leadframe 10, i.e. on which bonding areas are present, is not laid down in a single flat plane. Similarly, the surface opposite to this upper surface is also not in a single flat plane.

The leadframe 10 is embedded in reflective material 11 forming a package body 12 shaped to form a package. A mounting surface 14 is provided. The profile or shape of the leadframe 10 results in some parts 16 of the mounting surface 14 being formed of an exposed, upper, surface of the leadframe 10—in this example all these regions are used for solder and so these parts will be referred to as solder bonding areas 16. The remainder of the mounting surface is of the reflective material.

The package body 12 forms a leadless package in which the leads of leadframe 10 do not extend beyond the reflective material of the package body.

The form of the package body 12 is a reflector cup with sidewalls of reflective material 11 and the mounting surface being of reflective material 11 except for the solder bonding areas.

FIG. 2 illustrates a packaged light emitting device 2 with an LED die 20 mounted in the package body 12 of FIG. 1. Solder 22 is provided on the solder bonding areas 16 leaving the remainder of the LED mounting surface clear of solder, and the solder thus completely covering the solder bonding areas 16. In the finished device, the solder 22 is in the form of a solder bump 22 and, as explained below, the solder may be applied as a paste or bump.

The LED die 20 has a plurality of metallization layers 24 illustrated schematically in FIG. 2 on the major surfaces of the LED die facing the mounting surface 14. These metallization layers 24 may include in particular an ohmic contact layer 32 in contact with the die, a reflective layer 34 and a protective guard layer 36 facing the LED mounting surface 14.

The LED die 20 has a solderable layer 26 which may be formed of any suitable material including for example Ag, NiPdAu or Au.

In this embodiment a phosphor layer 28 is dispensed, as discussed below, on the side of the LED die 20 facing away from the mounting surface 14, which is the side at which a major part of the light generated by the LED die 20 exits. A silicone encapsulant 38 which may contain phosphor is provided enclosing and encapsulating the LED die 20.

Such packaged LEDs may be manufactured in a relatively straightforward way as will now be described.

Figure 3:
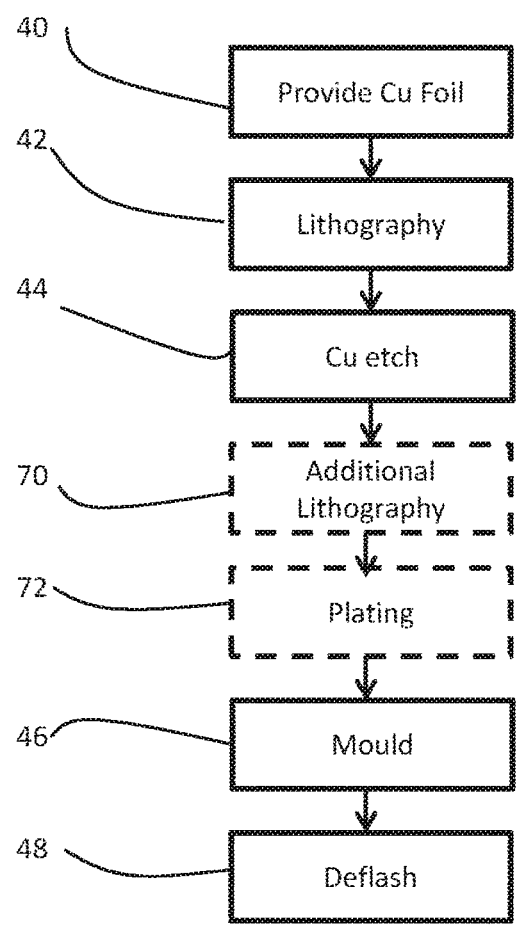
FIG. 3 is a flow diagram of the process flow used to manufacture the package of FIG. 1.

FIG. 3 illustrates a process for the forming package body 12 of FIG. 1.

A copper foil of thickness 20 to 500 µm, preferably 100 to 200 µm, is provided (step 40). A mask is deposited by lithography (step 42) and the copper foil is etched (step 44). The etching process results in a leadframe with a shaped profile in the thickness direction of the copper foil as illustrated in FIG. 1 in the plane of the foil as well as a pattern of leads viewed in a perpendicular direction to the thickness direction. Multiple mask and etch steps may be used if required to generate a leadframe with a relatively complex pattern and profile (optional step 70).

An optional plating step 72 may then be provided if required—see below.

The leadframe is then introduced into a mould and reflective material 11 introduced under heat and pressure (step 46) to form package 2 with the leadframe 10 embedded in the package body 12.

A deflash step (step 48) then removes flashes, i.e. excess package material, where required. This leads to a moulded leadframe with a continuous and flat LED mounting surface as illustrated in FIG. 1.

Note that the moulded leadframe at this stage may include multiple packages as illustrated in FIG. 1 joined together with bars of the reflective material for convenience in the subsequent steps. In an alternative arrangement metal bars from the leadframe may be used to join the packages together and it is then these that are cut to separate the packages in the singulation step described below.

Figure 4:
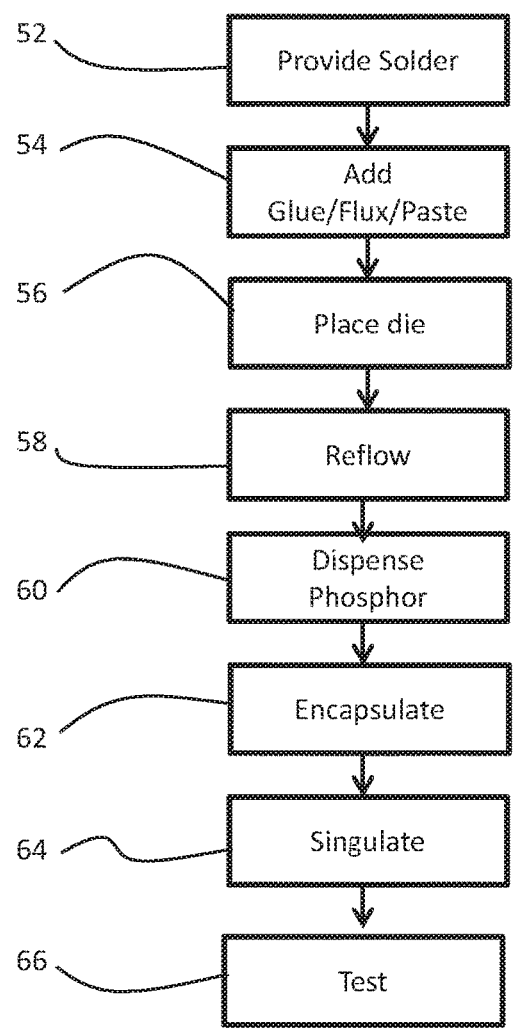
FIG. 4 is a flow diagram of the assembly of the package with the LED die mounted therein of FIG. 2.

The assembly flow used to package a die will now be described with reference to FIG. 4.

Solder paste is provided on the solder bonding areas (step 52). Note that because of the subsequent reflow step the solder at this stage does not need to be precisely aligned with the edges of the solder bonding areas and all that is required is that the solder bumps are on the correct respective solder bonding areas. The solder may be, for example, AuSn, Sn or tin silver copper (SAC) solder.

Alternatively, glue, flux and/or paste can be applied if required (step 54). In particular, conductive glue may be used.

A die 20 is then provided placed on the solder paste (step 56).

A curing step also known as a reflow step (step 58) is then carried out to melt the solder. During this step, the package with the die is heated to melt the solder which then spreads out to cover completely the solder bonding areas as the solder readily wets these areas. The reflective material acts as a solder material since the solder does not readily wet this area. This helps improve reliability. The solder makes good contact with solderable layer 26 on the die.

In an optional step phosphor 28 is then dispensed (step 60) onto the upper surface of the die 20 facing away from the package 2, at which surface a major part of the light generated by the LED die 20 will exit.

Silicone encapsulant 38 is provided to surround the die 20 and this is then cured (step 62) to protect the die.

The individual packages are then singulated (step 64) by breaking the bars connecting adjoining packages to provide a plurality of individual packaged LEDs as illustrated in FIG. 2.

Testing of the packaged LEDs then takes place (step 66).

The LED and package as described above lead to a number of features.

Firstly, note that since the silver is not used as a reflective layer in the arrangements described, there is no problem with tarnishing of the silver. The whole of the side walls of the package and the LED mounting surface are of the reflective material except for the specific solder bonding areas which are covered with solder in the packaged LED.

In this arrangement, there is no silver layer between the die 20 and package 2 and this leads to improved adhesion of the die 20 to the package 2.

The flexibility provided by the LED and package allows the LED to be centrally mounted within the package without incurring the increased package size necessary when using alternative technologies such as wirebonding.

The reliability of the packaged LED is improved by the use of the reflective material as a solder resist since this prevents the solder spreading in a less controlled manner.

The package can also deliver good thermal performance because of the direct connection of the copper leadframe to the die 20. Note that the solder bonding areas 16 can be designed to be large enough to deliver good heat sinking.

The approach inherently is not overly susceptible to problems with thermal mismatch.

In an alternative approach, solder is provided on the die 20 instead of on the package in step 52. In particular, solder bumps may be formed on the solderable areas 26 of the die, and the die is then mounted with the solder bumps facing the solder bonding areas 16.

The subsequent reflow step takes place as above (step 58) and as in the embodiment above the solder bonding areas 16 act to self-align the solder with the surrounding reflective material. This surface tension effect, in which the solder is repelled by and will not adhere to the surface of the reflective material, can also act to assist in accurately aligning the die.

In embodiments of the invention, after etching the copper foil to form the leadframe 10 in step 42, metal plating is provided (step 72). In one embodiment, silver plating of the whole leadframe is provided. Alternatively, silver or alternative plating for example of Sn or NiPdAu may be provided only in the solder bonding areas or on the lower side or surface of the leadframe, which is the side or surface opposite to the bonding areas.

Figure 5:
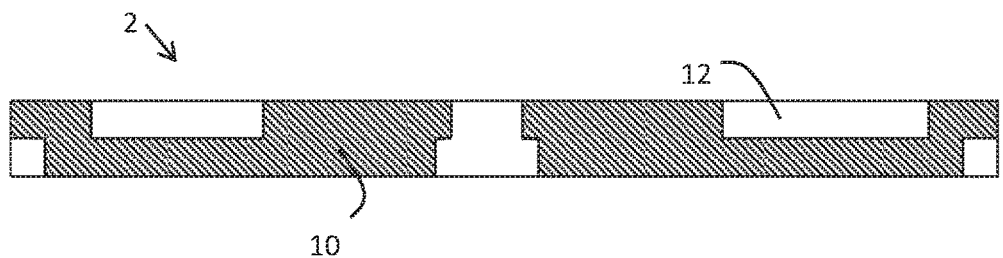
FIG. 5 is an alternative package for an LED die.

Alternative shapes of package are possible. In particular, instead of forming a reflector cup with sidewalls a flat package may be provided without the sidewalls. In this case, the package is of constant thickness as illustrated in FIG. 5.

The LED die can be from a broad application range. The packaging approach is suitable for low power LEDs to high power LEDs. The approach allows significant freedom in choosing package shapes while retaining the same manufacturing process.

Further, alternatives to an LED may be used as a light emitting device. Alternative solid state devices in particular laser diodes may be used. In a specific example, the invention may relate to the packaging of a VCSEL or VECSEL light emitting device die.

Figure 6:
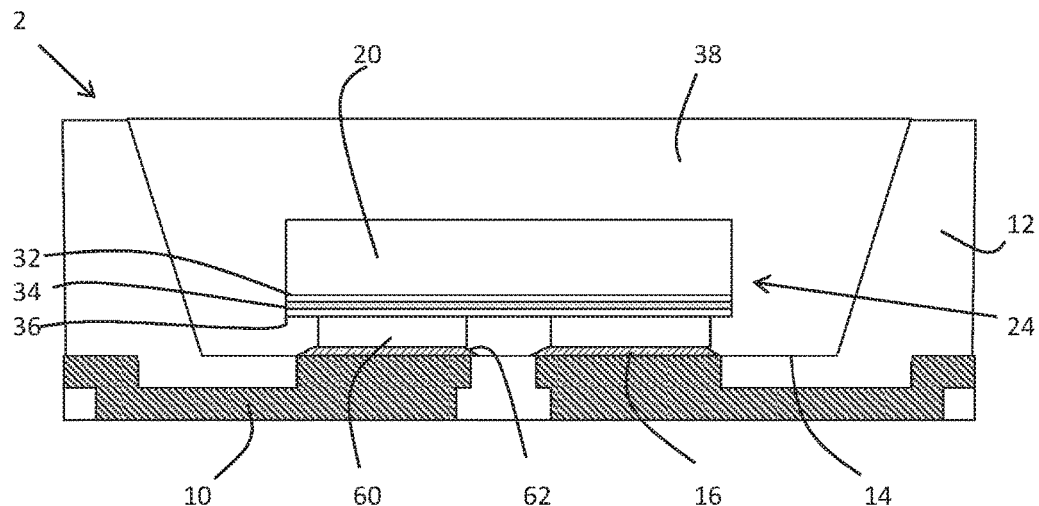
FIG. 6 shows an alternative packaged LED.

FIG. 6 illustrates an alternative embodiment in which gold bumps or other metal bumps e.g. Cu are used.

In this case, the die is formed with gold bumps 60 which act as a replacement for the solderable areas 26. In other words, in this case the solderable areas are of significant thickness. The gold bumps are then soldered to the package as above by providing solder paste on the solder bonding areas 16, bringing the die with gold bumps 60 into contact with the solder bonding areas, and carrying out a reflow step to reflow the solder paste to solder the gold bumps 60 to solder bonding areas 16 using solder layer 62.

Figure 7:
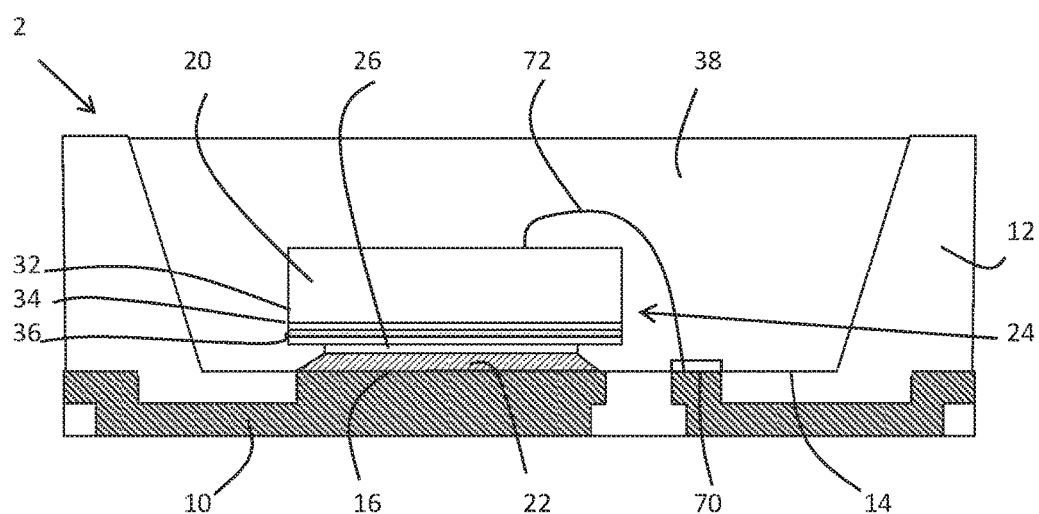
FIG. 7 shows a further alternative packaged LED.

In an alternative embodiment, illustrated in FIG. 7, wirebonding may be used additionally. In such a case, a single solder bonding area 16 may be provided on the LED mounting area 14 connecting to a single side of the LED die 20 and a second connection to the LED die is made by wirebonding. A wire 72 is used to connect die 20 to wirebonding area 70. Note that the wirebonding area 70 is also part of the leadframe 10 exposed at the mounting surface 14. For wirebonding applications some silver plating 74 on the copper leadframe may optionally be provided to assist in bonding wire 72 to leadframe 10. Thus, in this arrangement the whole of the mounting surface is of reflective material 11 except for the solder bonding area 16 and the wirebonding area 70.

Multiple solder bonding areas and/or wirebonding areas may be provided if required to connect the die.

Any suitable alloy of Cu or other material may be used for leadframe 10.

Instead of dispensing phosphor 28 in step 60 alternative methods of applying the phosphor include spraying or laminating. Further, note that if the phosphor is included in silicone encapsulant 38, a separate step 60 of dispensing phosphor (step 78) may not be required.

In the examples above, the profiled leadframe 10 is formed by etching. However, alternative methods of forming a leadframe with a profile may also be used. For example, it may also be possible to form a leadframe of the required shape using a stamping process.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A packaged light emitting device comprising:
a package comprising a body having a reflective surface, the package further comprising a leadframe;
the leadframe having a raised portion and a lower portion, the raised portion being exposed through the reflective surface of the body to define at least one solder bonding area surrounded by the reflective surface;
a mounting surface for a light emitting device die comprising a continuous planar surface formed of the at least one solder bonding area and the reflective surface,
wherein the planar reflective surface resists solder so that the solder does not adhere to the planar reflective surface;
the lower portion of the leadframe being encased in the body;
solder covering the at least one solder bonding area but not the surrounding reflective surface; and
the light emitting device die mounted to the at least one solder bonding area by the solder, such that the reflective surface planar with the at least one solder area surrounds the light emitting device die.

2. A packaged light emitting device according to claim 1 wherein:
the leadframe is additionally exposed at the mounting surface to define at least one wire bonding area; and
the mounting surface is of the reflective surface apart from the at least one solder bonding area and the at least one wire bonding area;
the device further comprising at least one bonding wire connecting the die to the at least one wire bonding area.

3. A packaged light emitting device according to claim 1 wherein the body is in the form of a reflective cup.

4. A packaged light emitting device according to claim 1 wherein the body is flat.

\* \* \* \* \*